(12) United States Patent
Niwa et al.

(10) Patent No.: US 12,364,068 B2
(45) Date of Patent: Jul. 15, 2025

(54) SEMICONDUCTOR LIGHT-EMITTING ELEMENT AND METHOD OF MANUFACTURING SEMICONDUCTOR LIGHT-EMITTING ELEMENT

(71) Applicant: NIKKISO CO., LTD., Tokyo (JP)

(72) Inventors: Noritaka Niwa, Ishikawa (JP);
Tetsuhiko Inazu, Ishikawa (JP);
Haruhisa Aida, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 544 days.

(21) Appl. No.: 17/876,258

(22) Filed: Jul. 28, 2022

(65) Prior Publication Data
US 2023/0035901 A1 Feb. 2, 2023

(30) Foreign Application Priority Data
Jul. 30, 2021 (JP) .................................. 2021-126106

(51) Int. Cl.
*H10H 20/832* (2025.01)
*H10H 20/01* (2025.01)
(Continued)

(52) U.S. Cl.
CPC ..... *H10H 20/835* (2025.01); *H10H 20/01335* (2025.01); *H10H 20/032* (2025.01); *H10H 20/825* (2025.01); *H10H 20/84* (2025.01)

(58) Field of Classification Search
CPC .......... H10H 20/835; H10H 20/01335; H10H 20/032; H10H 20/825; H10H 20/84
See application file for complete search history.

(56) References Cited

U.S. PATENT DOCUMENTS

2021/0407817 A1* 12/2021 Marchegiani ....... H01L 21/0234
2022/0085244 A1* 3/2022 Masamoto ........... H10H 20/831

FOREIGN PATENT DOCUMENTS

JP 2018142687 A 9/2018
JP 2019079982 A 5/2019
(Continued)

OTHER PUBLICATIONS

W. Macherzyński and B. Paszkiewicz, "Development of diffusion barriers for Ti/Al based ohmic contact to AlGaN/GaN heterostructures," The Ninth International Conference on Advanced Semiconductor Devices and Mircosystems, Smolenice, Slovakia, 2012, pp. 203-206, doi: 10.1109/ASDAM.2012.6418532 (Year: 2012).*

(Continued)

*Primary Examiner* — Sitaramarao S Yechuri
(74) *Attorney, Agent, or Firm* — MUNCY, GEISSLER, OLDS & LOWE, P.C.

(57) ABSTRACT

A semiconductor light-emitting element includes: an n-type semiconductor layer made of an n-type AlGaN-based semiconductor material; an active layer provided on the n-type semiconductor layer and made of an AlGaN-based semiconductor material; a p-type semiconductor layer provided on the active layer; a p-side contact electrode that includes a Rh layer in contact with an upper surface of the p-type semiconductor layer; and a p-side current diffusion layer that is in contact with an upper surface and a side surface of the p-side contact electrode and includes a TiN layer, a Ti layer, a Rh layer, and a TiN layer stacked successively. A film density of the Rh layer included in the p-side contact electrode is larger than a film density of the Rh layer included in the p-side current diffusion layer.

5 Claims, 5 Drawing Sheets

(51) Int. Cl.
    *H10H 20/825*     (2025.01)
    *H10H 20/84*     (2025.01)

(56)         References Cited

FOREIGN PATENT DOCUMENTS

| | | | |
|---|---|---|---|
| JP | 2020191420 A | * | 11/2020 |
| JP | 6839320 B | | 3/2021 |
| JP | 6867536 B1 | | 4/2021 |
| JP | 2021072376 A | | 5/2021 |
| WO | WO2010125810 A1 | | 11/2010 |
| WO | WO2014068965 A1 | | 5/2014 |

OTHER PUBLICATIONS

Office Action of Taiwanese Application No. 111127697 dated Mar. 27, 2023 and English translation, 10 pages.

* cited by examiner

SEMICONDUCTOR LIGHT-EMITTING ELEMENT AND METHOD OF MANUFACTURING SEMICONDUCTOR LIGHT-EMITTING ELEMENT

RELATED APPLICATION

Priority is claimed to Japanese Patent Application No. 2021-126106, filed on Jul. 30, 2021, the entire content of which is incorporated herein by reference.

BACKGROUND OF THE INVENTION

1. Field of the Invention

The present invention relates to a semiconductor light-emitting element and a method of manufacturing a semiconductor light-emitting element.

2. Description of the Related Art

A semiconductor light-emitting element includes an n-type semiconductor layer, an active layer, and a p-type semiconductor layer stacked on a substrate. A p-side contact electrode is provided on the p-type semiconductor layer, and a dielectric layer is provided on the p-side contact electrode. In a semiconductor light-emitting element for outputting deep ultraviolet light, rhodium (Rh) having a high reflectivity for the emission wavelength may be used in the p-side contact electrode (see, for example, JP6839320B).

Adhesion of Rh to a dielectric material is poor so that the element reliability may be lowered due to exfoliation of the dielectric layer. Further, when the dielectric layer on the p-side contact electrode is removed to form a connection opening, a damage associated with the removal of the dielectric layer may be caused in the p-side contact electrode exposed in the connection opening with the result that the reflective characteristics of the p-side contact electrode may be lowered.

SUMMARY OF THE INVENTION

The present invention addresses the above-described issues and a purpose thereof is to provide a technology for improving the reliability of a semiconductor light-emitting element.

A semiconductor light-emitting element according to an embodiment of the present invention includes: an n-type semiconductor layer made of an n-type AlGaN-based semiconductor material; an active layer provided on the n-type semiconductor layer and made of an AlGaN-based semiconductor material; a p-type semiconductor layer provided on the active layer; a p-side contact electrode that includes a Rh layer in contact with an upper surface of the p-type semiconductor layer; and a p-side current diffusion layer that is in contact with an upper surface and a side surface of the p-side contact electrode and includes a TiN layer, a Ti layer, a Rh layer, and a TiN layer stacked successively. A film density of the Rh layer included in the p-side contact electrode is equal to or more than 12.0 g/cm³, and a film density of the Rh layer included in the p-side current diffusion layer is equal to or more than 12.0 g/cm³.

Another embodiment of the present invention relates to a method of manufacturing a semiconductor light-emitting element. The method includes: forming an active layer made of an AlGaN-based semiconductor material on an n-type semiconductor layer made of an n-type AlGaN-based semiconductor material; forming a p-type semiconductor layer on the active layer; forming a p-side contact electrode that includes a Rh layer in contact with an upper surface of the p-type semiconductor layer by deposition; annealing the p-side contact electrode at a temperature equal to or more than 500° C. and equal to or less than 650° C.; forming a p-side current diffusion layer in contact with an upper surface and a side surface of the p-side contact electrode and including a TiN layer, a Ti layer, a Rh layer, and a TiN layer stacked successively; and heating the p-side current diffusion layer at a temperature equal to or more than 200° C. and equal to or less than 400° C.

DETAILED DESCRIPTION OF THE INVENTION

Figure 1:
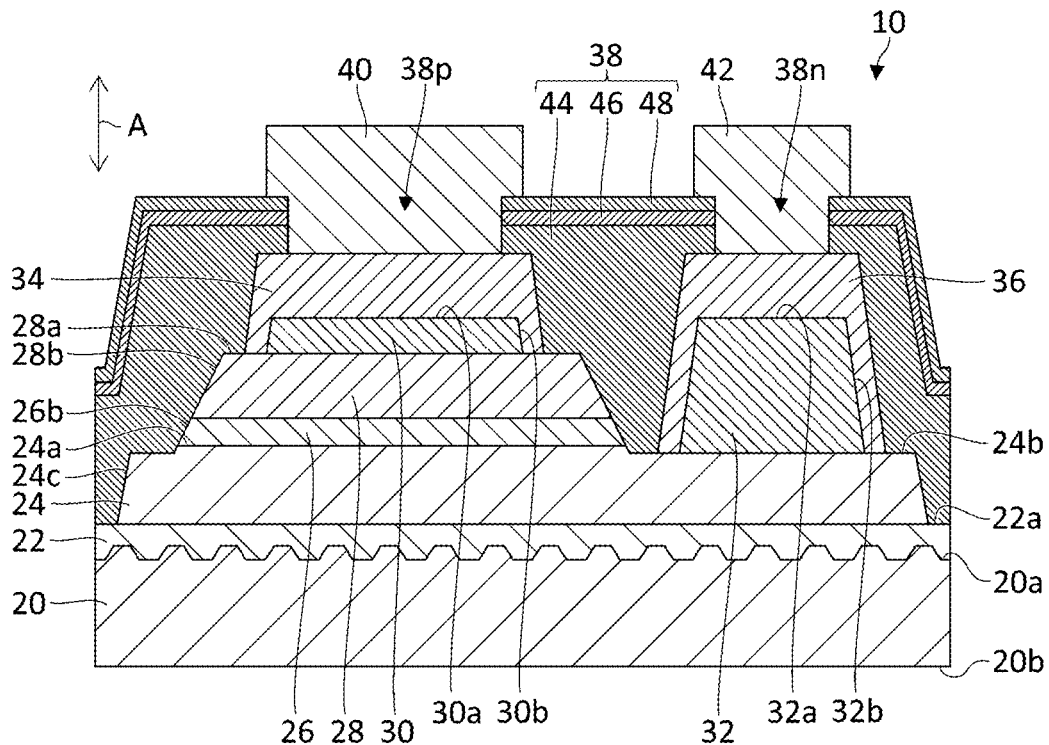
FIG. 1 is a cross sectional view schematically showing a configuration of a semiconductor light-emitting element according to an embodiment.

The invention will now be described by reference to the preferred embodiments. This does not intend to limit the scope of the present invention, but to exemplify the invention.

A detailed description will be given of an embodiment of the present invention with reference to the drawings. The numerals are used in the description to denote the same elements and a duplicate description is omitted as appropriate. To facilitate the understanding, the relative dimensions of the constituting elements in the drawings do not necessarily mirror the relative dimensions in the actual light-emitting element.

The semiconductor light-emitting element according to the embodiment is configured to emit "deep ultraviolet light" having a central wavelength A approximately equal to or less than 360 nm and is a so-called deep ultraviolet-light-emitting diode (UV-LED) chip. To output deep ultraviolet light having such a wavelength, an aluminum gallium nitride (AlGaN)-based semiconductor material having a band gap approximately equal to or more than 3.4 eV is used. The embodiment particularly shows a case of emitting deep ultraviolet light having a central wavelength A of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN equal to or more than 1%, and, preferably, equal to or more than 5%, equal to or more than 10%, or equal to or more than 20%.

Those materials that do not contain AlN may be distinguished by referring to them as "GaN-based semiconductor materials". "GaN-based semiconductor materials" include GaN or InGaN. Similarly, those materials that do not contain GaN may be distinguished by referring to them as "AlN-based semiconductor materials". "AlN-based semiconductor materials" include AlN or InAlN.

FIG. 1 is a cross sectional view schematically showing a configuration of a semiconductor light-emitting element 10 according to the embodiment. The semiconductor light-emitting element 10 includes a substrate 20, a base layer 22, an n-type semiconductor layer 24, an active layer 26, a p-type semiconductor layer 28, a p-side contact electrode 30, an n-side contact electrode 32, a p-side current diffusion layer 34, an n-side current diffusion layer 36, a protective layer 38, a p-side pad electrode 40, and an n-side pad electrode 42.

Referring to FIG. 1, the direction indicated by the arrow A may be referred to as "vertical direction" or "direction of thickness". Further, the direction away from the substrate 20 may be defined as "upward", and the direction toward the substrate 20 may be defined as "downward".

The substrate 20 includes a first principal surface 20a and a second principal surface 20b opposite to the first principal surface 20a. The first principal surface 20a is a crystal growth surface for growing the layers from the base layer 22 to the p-type semiconductor layer 28. The substrate 20 is made of a material having translucency for the deep ultraviolet light emitted by the semiconductor light-emitting element 10 and is made of, for example, sapphire ($Al_2O_3$). A fine concave-convex pattern having a submicron (1 μm or less) depth and pitch is formed on the first principal surface 20a. The substrate 20 like this is also called a patterned sapphire substrate (PSS). The second principal surface 20b is a light extraction substrate for extracting the deep ultraviolet light emitted by the active layer 26 outside. The substrate 20 may be made of AlN or made of AlGaN. The substrate 20 may be an ordinary substrate in which the first principal surface 20a is comprised of a flat surface that is not patterned.

The base layer 22 is provided on the first principal surface 20a of the substrate 20. The base layer 22 is a foundation layer (template layer) to form the n-type semiconductor layer 24. For example, the base layer 22 is an undoped AlN layer and is, specifically, an AlN (HT-AlN; High Temperature AlN) layer grown at a high temperature. The base layer 22 may further include an undoped AlGaN layer formed on the AlN layer. The base layer 22 may be comprised only of an undoped AlGaN layer when the substrate 20 is an AlN substrate or an AlGaN substrate. In other words, the base layer 22 includes at least one of an undoped AlN layer or an undoped AlGaN layer.

The n-type semiconductor layer 24 is provided on an upper surface 22a of the base layer 22. The n-type semiconductor layer 24 is made of an n-type AlGaN-based semiconductor material. For example, the n-type semiconductor layer 24 is doped with Si as an n-type impurity. The composition ratio of the n-type semiconductor layer 24 is selected to transmit the deep ultraviolet light emitted by the active layer 26. For example, the n-type semiconductor layer 24 is formed such that the molar fraction of AlN is equal to or more than 25%, and, preferably, equal to or more than 40% or equal to or more than 50%. The n-type semiconductor layer 24 has a band gap larger than the wavelength of the deep ultraviolet light emitted by the active layer 26. For example, the n-type semiconductor layer 24 is formed to have a band gap equal to or more than 4.3 eV. It is preferable to form the n-type semiconductor layer 24 such that the molar fraction of AlN is equal to or less than 80%, i.e., the band gap is equal to or less than 5.5 eV. It is more desired to form the n-type semiconductor layer 24 such that the molar fraction of AlN is equal to or less than 70% (i.e., the band gap is equal to or less than 5.2 eV). The n-type semiconductor layer 24 has a thickness equal to or more than 1 μm and equal to or less than 3 μm. For example, the n-type semiconductor layer 24 has a thickness of about 2 μm.

The n-type semiconductor layer 24 is formed such that the concentration of Si as the impurity is equal to or more than $1\times10^{18}/cm^3$ and equal to or less than $5\times10^{19}/cm^3$. It is preferred to form the n-type semiconductor layer 24 such that the Si concentration is equal to or more than $5\times10^{18}/cm^3$ and equal to or less than $3\times10^{19}/cm^3$ and, more preferably, equal to or more than $7\times10^{18}/cm^3$ and equal to or less than $2\times10^{19}/cm^3$. In one example, the Si concentration in the n-type semiconductor layer 24 is around $1\times10^{19}/cm^3$ and, more specifically, is in a range equal to or more than $8\times10^{18}/cm^3$ and equal to or less than $1.5\times10^{19}/cm^3$.

The n-type semiconductor layer 24 includes a first upper surface 24a and a second upper surface 24b. The first upper surface 24a is where the active layer 26 is formed, and the second upper surface 24b is where the active layer 26 is not formed.

The active layer 26 is provided on the first upper surface 24a of the n-type semiconductor layer 24. The active layer 26 is made of an AlGaN-based semiconductor material and has a double heterojunction structure by being sandwiched between the n-type semiconductor layer 24 and the p-type semiconductor layer 28. To output deep ultraviolet light having a wavelength equal to or less than 355 nm, the active layer 26 is formed to have a band gap equal to or more than 3.4 eV. For example, the AlN composition ratio of the active layer 26 is selected so as to output deep ultraviolet light having a wavelength equal to or less than 320 nm.

For example, the active layer 26 has a monolayer or multilayer quantum well structure and is comprised of a barrier layer made of an undoped AlGaN-based semiconductor material and a well layer made of an undoped AlGaN-based semiconductor material. The active layer 26 includes, for example, a first barrier layer directly in contact with the n-type semiconductor layer 24 and a first well layer provided on the first barrier layer. One or more pairs of the barrier layer and the well layer may be additionally provided between the first well layer and the p-type semiconductor layer 28. Each of the barrier layer and the well layer has a thickness equal to or more than 1 nm and equal to or less than 20 nm, and have, for example, a thickness equal to or more than 2 nm and equal to or less than 10 nm.

An electron blocking layer may further be provided between the active layer 26 and the p-type semiconductor layer 28. The electron blocking layer is made of an undoped AlGaN-based semiconductor material and is formed such that, for example, the molar fraction of AlN is equal to or more than 40%, and, preferably, equal to or more than 50%. The electron blocking layer may be formed such that the molar fraction of AlN is equal to or more than 80% or may be made of an AlN-based semiconductor material that does not contain GaN. The electron blocking layer has a thickness equal to or more than 1 nm and equal to or less than 10 nm. For example, the electron blocking layer has a thickness equal to or more than 2 nm and equal to or less than 5 nm.

The p-type semiconductor layer 28 is formed on the active layer 26. The p-type semiconductor layer 28 is a p-type AlGaN-based semiconductor material layer or a p-type GaN-based semiconductor material layer. For example, the p-type semiconductor layer 28 is an AlGaN layer or a GaN layer doped with magnesium (Mg) as a p-type impurity. The p-type semiconductor layer 28 has, for example, a thickness equal to or more than 20 nm and equal to or less than 400 nm.

The p-type semiconductor layer 28 may be comprised of a plurality of layers. The p-type semiconductor layer 28 may include, for example, a p-type clad layer and a p-type contact layer. The p-type clad layer is a p-type AlGaN layer having a relatively high AlN ratio as compared with the p-type contact layer and is provided to be directly in contact with the active layer 26. The p-type contact layer is a p-type AlGaN layer or a p-type GaN layer having a relatively low AlN ratio as compared with the p-type clad layer. The p-type contact layer is provided on the p-type clad layer and is provided to be directly in contact with the p-side contact electrode 30. The p-type clad layer may include a p-type first clad layer and a p-type second clad layer.

The composition ratio of the p-type first clad layer is selected to transmit the deep ultraviolet light emitted by the active layer 26. For example, the p-type first clad layer is formed such that the molar fraction of AlN is equal to or more than 25%, and, preferably, equal to or more than 40% or equal to or more than 50%. The AlN ratio of the p-type first clad layer is, for example, similar to the AlN ratio of the n-type semiconductor layer 24 or larger than the AlN ratio of the n-type semiconductor layer 24. The AlN ratio of the p-type clad layer may be equal to or more than 70% or equal to or more than 80%. The p-type first clad layer has a thickness equal to or more than 10 nm and equal to or less than 100 nm. For example, the p-type first clad layer has a thickness equal to or more than 15 nm and equal to or less than 70 nm.

The p-type second clad layer is provided on the p-type first clad layer. The p-type second clad layer is a p-type AlGaN layer having a medium AlN ratio and has an AlN ratio lower than that of the p-type first clad layer and higher than that of the p-type contact layer. For example, the p-type second clad layer is formed such that the molar fraction of AlN is equal to or more than 25%, and, preferably, equal to or more than 40% or equal to or more than 50%. The AlN ratio of the p-type second clad layer is configured to be, for example, about ±10% of the AlN ratio of the n-type semiconductor layer 24. The p-type second clad layer has a thickness equal to or more than 5 nm and equal to or less than 250 nm and has, for example, a thickness equal to or more than 10 nm and equal to or less than 150 nm. The p-type second clad layer may not be provided. The p-type clad layer may be comprised only of the p-type first clad layer.

The p-type contact layer is a p-type AlGaN layer or a p-type GaN layer having a relatively low AlN ratio. The p-type contact layer is formed such that the AlN ratio is equal to or less than 20% in order to obtain proper ohmic contact with the p-side contact electrode 30. Preferably, the p-type contact layer is formed such that the AlN ratio is equal to or less than 10%, equal to or less than 5%, or 0%. In other words, the p-type contact layer may be made of a p-type GaN-based semiconductor material that does not substantially contain AlN. As a result, the p-type contact layer could absorb the deep ultraviolet light emitted by the active layer 26. It is preferred to form the p-type contact layer to be thin to reduce the quantity of absorption of the deep ultraviolet light emitted by the active layer 26. The p-type contact layer has a thickness equal to or more than 5 nm and equal to or less than 30 nm and has, for example, a thickness equal to or more than 10 nm and equal to or less than 20 nm.

The p-side contact electrode 30 is provided on an upper surface 28a of the p-type semiconductor layer 28. The p-side contact electrode 30 can be in ohmic contact with the p-type semiconductor layer 28 (for example, the p-type contact layer) and is made of a material having a high reflectivity for the deep ultraviolet light emitted by the active layer 26. The p-side contact electrode 30 includes a Rh layer directly in contact with the upper surface 28a of the p-type semiconductor layer 28. The p-side contact electrode 30 may be, for example, comprised only of the Rh layer. The thickness of the Rh layer included in the p-side contact electrode 30 is equal to or more than 50 nm and equal to or less than 200 nm and is, for example, equal to or more than 70 nm and equal to or less than 150 nm.

The film density of the Rh layer included in the p-side contact electrode 30 is equal to or more than 12.0 $g/cm^3$ and is, for example, equal to or more than 12.2 $g/cm^3$ and equal to or less than 12.5 $g/cm^3$. By configuring the film density of the Rh layer included in the p-side contact electrode 30 to be large, the function of the p-side contact electrode 30 as a reflection electrode can be enhanced. By configuring the film density of the Rh layer to be equal to or more than 12 $g/cm^3$, the reflectivity equal to or more than 65% for deep ultraviolet light having a wavelength of 280 nm can be obtained. By way of one example, the Rh layer included in the p-side contact electrode 30 has a film density of 12.42 $g/cm^3$ and has a reflectivity of 66.8% for deep ultraviolet light having a wavelength of 280 nm. Further, the Ar concentration in the Rh layer included in the p-side contact electrode 30 is equal to or more than $1\times10^{16}/cm^3$ and less than $1\times10^{18}/cm^3$. By configuring the Ar concentration in the Rh layer included in the p-side contact electrode 30 to be low, the film quality of the Rh layer can be improved and the function of the p-side contact electrode 30 as a reflection electrode can be enhanced.

The n-side contact electrode 32 is provided on the second upper surface 24b of the n-type semiconductor layer 24. The n-side contact electrode 32 includes a first Ti layer, an Al layer, a second Ti layer, and a TiN layer stacked successively. The detail of the configuration of the n-side contact electrode 32 will be described separately with reference to FIG. 3.

The p-side current diffusion layer 34 is provided to be directly in contact with an upper surface 30a and a side surface 30b of the p-side contact electrode 30 and to cover the entirety of the p-side contact electrode 30. The p-side current diffusion layer 34 includes a TiN layer, a Ti layer, a Rh layer, and a TiN layer stacked successively. The detail of the configuration of the p-side current diffusion layer 34 will be described separately with reference to FIG. 2.

The n-side current diffusion layer 36 is provided to cover an upper surface 32a and a side surface 32b of the n-side contact electrode 32. The n-side current diffusion layer 36 is configured in a manner similar to the p-side current diffusion layer 34 and includes a TiN layer, a Ti layer, a Rh layer, and a TiN layer stacked successively. The detail of the configuration of the n-side current diffusion layer 36 will be described separately with reference to FIG. 3.

The protective layer 38 includes a p-side pad opening 38p provided on the p-side current diffusion layer 34 and an n-side pad opening 38n provided on the n-side current diffusion layer 36. The protective 38 covers the p-side current diffusion layer 34 in a portion different from the p-side pad opening 38p and covers the n-side current diffusion layer 36 in a portion different from the n-side pad opening 38n. The protective layer 38 is provided to cover the entirety of the element from above and is provided to cover the upper surface 22a of the base layer 22, the upper surface 24b and a side surface 24c of the n-type semiconductor layer 24, a side surface 26b of the active layer 26, the upper surface 28a and a side surface 28b of the p-type semiconductor layer 28, the p-side current diffusion layer 34, and the n-side current diffusion layer 36.

The protective layer 38 includes a first dielectric layer 44, a second dielectric layer 46, and a third dielectric layer 48. Each of the first dielectric layer 44, the second dielectric layer 46, and the third dielectric layer 48 is made of a material that does not substantially absorb the deep ultraviolet light emitted by the active layer 26 and is made of a material having a transmittance equal to or more than 80% for the wavelength of the deep ultraviolet light emitted by the active layer 26. Such a material is exemplified by an oxide material such as silicon oxide ($SiO_2$), aluminum oxide ($Al_2O_3$), and hafnium oxide ($HfO_2$).

The first dielectric layer 44 is directly in contact with the n-type semiconductor layer 24, the active layer 26, the p-type semiconductor layer 28, the p-side current diffusion layer 34, and the n-side current diffusion layer 36. The first dielectric layer 44 is made of a first oxide material and is made of $SiO_2$, $Al_2O_3$, or $HfO_2$. The first dielectric layer 44 is preferably made of $SiO_2$. The thickness of the first dielectric layer 44 is equal to or more than 300 nm and equal to or less than 1500 nm and is, for example, about equal to more than 600 nm and equal to or less than 1000 nm.

The second dielectric layer 46 is provided on the first dielectric layer 44 and is provided to cover the entirety of the first dielectric layer 44. The second dielectric layer 46 is made of a second oxide material different from that of the first dielectric layer 44 and is made of $SiO_2$, $Al_2O_3$, or $HfO_2$. The second dielectric layer 46 is preferably made of $Al_2O_3$. By configuring the material of the second dielectric layer 46 to be different from the material of the first dielectric layer 44, pin holes that could be produced in the first dielectric layer 44 can be blocked to increase the quality of sealing. The thickness of the second dielectric layer 46 is equal to or more than 10 nm and equal to or less than 100 nm and is, for example, equal to or more than 20 nm and equal to or less than 50 nm.

The third dielectric layer 48 is provided on the second dielectric layer 46 and is provided to cover the entirety of the second dielectric layer 46. The third dielectric layer 48 is made of a third oxide material different from the second oxide material forming the second dielectric layer 46 and is preferably made of $SiO_2$. By configuring the material of the third dielectric layer 48 to be different from the material of the second dielectric layer 46, pin holes that could be produced in the second dielectric layer 46 can be blocked to increase the sealing performance. The thickness of the third dielectric layer 48 is equal to or more than 10 nm and equal to or less than 100 nm and is, for example, equal to or more than 20 nm and equal to or less than 50 nm.

The p-side pad electrode 40 is provided on the p-side current diffusion layer 34 and connects to the p-side current diffusion layer 34 in the p-side pad opening 38p. The p-side pad electrode 40 is provided to block the p-side pad opening 38p and overlaps the protective layer 38 outside the p-side pad opening 38p. The p-side pad electrode 40 is electrically connected to the p-side contact electrode 30 via the p-side current diffusion layer 34.

The n-side pad electrode 42 is provided on the n-side current diffusion layer 36 and connects to the n-side current diffusion layer 36 in the n-side pad opening 38n. The n-side pad electrode 42 is provided to block the n-side pad opening 38n and overlaps the protective layer 38 outside the n-side pad opening 38n. The n-side pad electrode 42 is electrically connected to the n-side contact electrode 32 via the n-side current diffusion layer 36.

The p-side pad electrode 40 and the n-side pad electrode 42 are portions bonded when the semiconductor light-emitting element 10 is mounted on a package substrate or the like. The p-side pad electrode 40 and the n-side pad electrode 42 include, for example, a Ni/Au, Ti/Au, or Ti/Pt/Au stack structure. The thickness of each of the p-side pad electrode 40 and the n-side pad electrode 42 is equal to or more than 100 nm and is, for example, equal to or more than 200 nm and equal to or less than 1000 nm.

Figure 2:
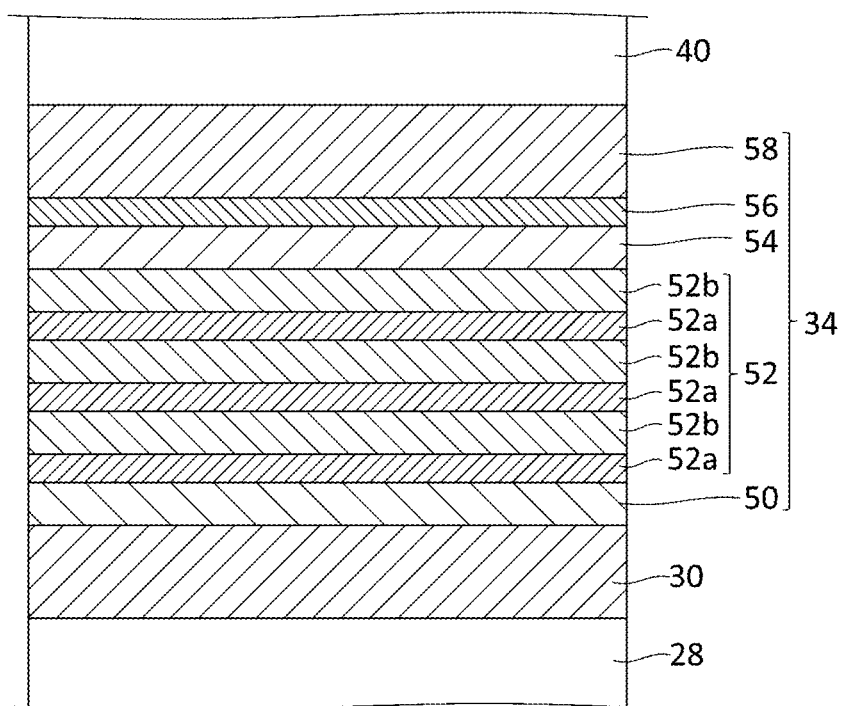
FIG. 2 is a cross sectional view schematically showing a configuration of the p-side contact electrode and the p-side current diffusion layer.

FIG. 2 schematically shows a configuration of the p-side contact electrode 30 and the p-side current diffusion layer 34. The p-side contact electrode 30 is comprised of a Rh layer. The p-side current diffusion layer 34 includes a first TiN layer 50, a multilayer metal film 52, and a second TiN layer 54. The p-side current diffusion layer 34 may further include a Ti layer 56 and an Au layer 58.

The first TiN layer 50 of the p-side current diffusion layer 34 is directly in contact with the Rh layer of the p-side contact electrode 30. The multilayer metal film 52 of the p-side current diffusion layer 34 is provided on the first TiN layer 50. The second TiN layer 54 of the p-side current diffusion layer 34 is provided on the multilayer metal film 52. The first TiN layer 50 and the second TiN layer 54 are made of conductive TiN. The thickness of each of the first TiN layer 50 and the second TiN layer 54 is equal to or more than 10 nm and equal to or less than 200 nm and is, for example, equal to or more than 50 nm and equal to or less than 150 nm.

The multilayer metal film 52 of the p-side current diffusion layer 34 includes a Ti layer 52a and a Rh layer 52b. The multilayer metal film 52 may include a plurality of Ti layers 52a and a plurality of Rh layers 52b that are alternately stacked. The thickness of each of the Ti layer 52a and the Rh layer 52b is equal to or more than 10 nm and equal to or less than 200 nm and is, for example, equal to or more than 20 nm and equal to or less than 150 nm. The film density of the Rh layer 52b included in the p-side current diffusion layer 34 is equal to or more than 12.0 $g/cm^3$ and is, for example, equal to or more than 12.2 $g/cm^3$ and less than 12.5 $g/cm^3$. The film density of the Rh layer included in the p-side contact electrode 30 may be larger than the film density of the Rh layer 52b. By way of one example, the Rh layer 52b included in the p-side current diffusion layer 34 has a film density of 12.37 $g/cm^3$ and has a reflectivity of 66.0% for ultraviolet light having a wavelength of 280 nm. The Ar concentration in the Rh layer 52b included in the p-side current diffusion layer 34 is larger than the Ar concentration in the Rh layer included in the p-side contact electrode 30. The Ar concentration in the Rh layer 52b is, for example, equal to or more than $1 \times 10^{18}/cm^3$ and equal to or less than $5 \times 10^{20}/cm^3$.

The Ti layer 56 of the p-side current diffusion layer 34 is provided on the second TiN layer 54. The thickness of the Ti layer 56 is equal to or more than 1 nm and equal to or less than 50 nm and is, for example, equal to or more than 5 nm and equal to or less than 25 nm. The Au layer 58 of the p-side current diffusion layer 34 is provided on the Ti layer 56. The thickness of the Au layer 58 is equal to or more than 100 nm and equal to or less than 500 nm and is, for example, equal to or more than 150 nm and equal to or less than 300 nm.

Figure 3:
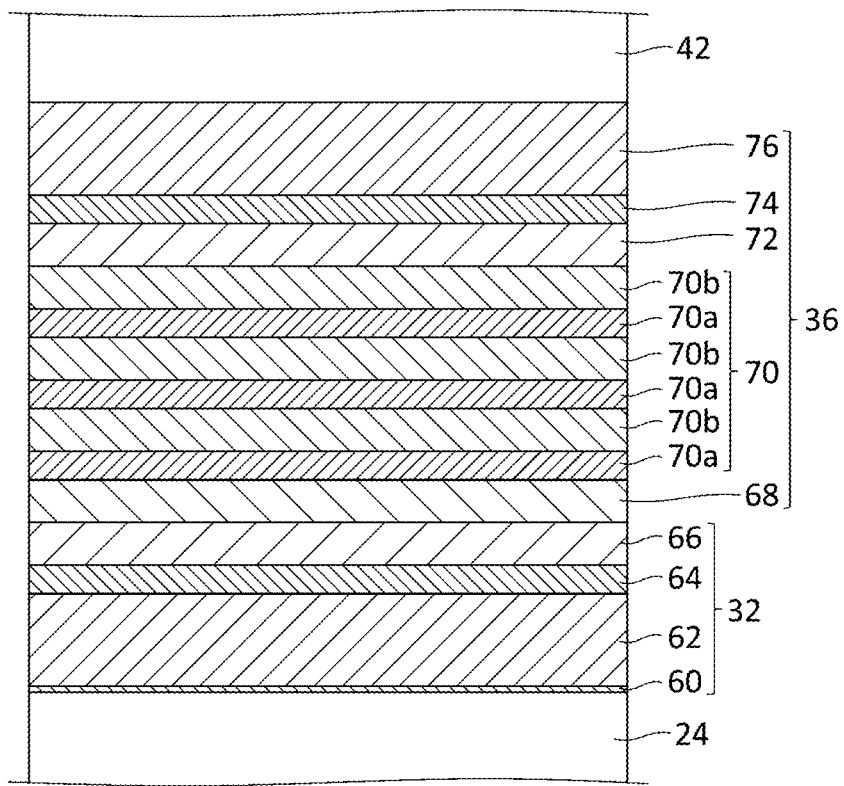
FIG. 3 is a cross sectional view schematically showing a configuration of the n-side contact electrode and the n-side current diffusion layer.

FIG. 3 schematically shows a configuration of the n-side contact electrode 32 and the n-side current diffusion layer 36. The n-side contact electrode 32 includes a first Ti layer 60, an Al layer 62, a second Ti layer 64, and a TiN layer 66. The n-side current diffusion layer 36 includes a first TiN layer 68, a multilayer metal film 70, and a second TiN layer 72. The n-side current diffusion layer 36 may further include a Ti layer 74 and an Au layer 76.

The first Ti layer 60 of the n-side contact electrode 32 is directly in contact with the second upper surface 24b of the n-type semiconductor layer 24. The thickness of the first Ti layer 60 is equal to or more than 1 nm and equal to or less than 10 nm and is, preferably, equal to or less than 5 nm or equal to or less than 2 nm. The Al layer 62 of the n-side contact electrode 32 is provided on the first Ti layer 60 and is directly in contact with the first Ti layer 60. The thickness of the Al layer 62 is equal to or more than 200 nm and is, for example, equal to or more than 300 nm and equal to or less than 1000 nm. The second Ti layer 66 of the n-side contact electrode 32 is provided on the Al layer 62 and is directly in contact with the Al layer 62. The thickness of the second Ti layer 64 is equal to or more than 1 nm and equal to or less than 50 nm and is, for example, equal to or more than 5 nm and equal to or less than 25 nm. The TiN layer 66 of the n-side contact electrode 32 is provided on the second Ti layer 64 and is directly in contact with the second Ti layer 64. The TiN layer 66 is made of conductive TiN. The thickness of the TiN layer 66 is equal to or more than 5 nm and equal to or less than 100 nm and is, for example, equal to or more than 10 nm and equal to or less than 50 nm.

The first TiN layer 68 of the n-side current diffusion layer 36 is directly in contact with the upper surface 32a and the side surface 32b of the n-side contact electrode 32. The multilayer metal film 70 of the n-side current diffusion layer 36 is provided on the first TiN layer 68. The second TiN layer 72 of the n-side current diffusion layer 36 is provided on the multilayer metal film 70. The first TiN layer 68 and the second TiN layer 72 are made of conductive TiN. The thickness of each of the first TiN layer 68 and the second TiN layer 72 is equal to or more than 10 nm and equal to or less than 200 nm and is, for example, equal to or more than 50 nm and equal to or less than 150 nm.

Like the multilayer metal film 52 of the p-side current diffusion layer 34, the multilayer metal film 70 of the n-side current diffusion layer 36 is comprised of a Ti layer 70a and a Rh layer 70b. The multilayer metal film 70 may include a plurality of Ti layers 70a and a plurality of Rh layers 70b that are alternately stacked. The thickness of each of the Ti layer 70a and the Rh layer 70b included in the multilayer metal film 70 is equal to or more than 10 nm and equal to or less than 200 nm and is, for example, equal to or more than 20 nm and equal to or less than 150 nm. The film density and the Ar concentration of the Rh layer 70b included in the n-side current diffusion layer 36 are similar to the film density and the Ar concentration of the Rh layer 52b included in the p-side current diffusion layer 34. The film density of the Rh layer 70b is equal to or more than 12.0 g/cm$^3$ and is, for example, equal to or more than 12.2 g/cm$^3$ and equal to or less than 12.5 g/cm$^3$. The Ar concentration in the Rh layer 70b is equal to or more than $1\times10^{18}$/cm$^3$ and less than $1\times10^{21}$/cm$^3$.

The Ti layer 74 of the n-side current diffusion layer 36 is provided on the second TiN layer 72. The thickness of the Ti layer 74 is equal to or more than 1 nm and equal to or less than 50 nm and is, for example, equal to or more than 5 nm and equal to or less than 25 nm. The Au layer 76 of the n-side current diffusion layer 36 is provided on the Ti layer 74. The thickness of the Au layer 76 is equal to or more than 100 nm and equal to or less than 500 nm and is, for example, equal to or more than 150 nm and equal to or less than 300 nm.

A description will now be given of a method of manufacturing the semiconductor light-emitting element 10. FIGS. 4-9 schematically show steps of manufacturing the semiconductor light-emitting element 10. First, referring to FIG. 4, the base layer 22, the n-type semiconductor layer 24, the active layer 26, and the p-type semiconductor layer 28 are formed on the first principal surface 20a of the substrate 20 sequentially.

The substrate 20 is, for example, a patterned sapphire substrate. The base layer 22 includes, for example, an HT-AlN layer and an undoped AlGaN layer. The n-type semiconductor layer 24, the active layer 26, and the p-type semiconductor layer 28 are semiconductor layers made of an AlGaN-based semiconductor material, an AlN-based semiconductor material, or a GaN-based semiconductor material and can be formed by a well-known epitaxial growth method such as the metal organic vapor phase epitaxy (MOVPE) method and the molecular beam epitaxy (MBE) method.

Figure 4:
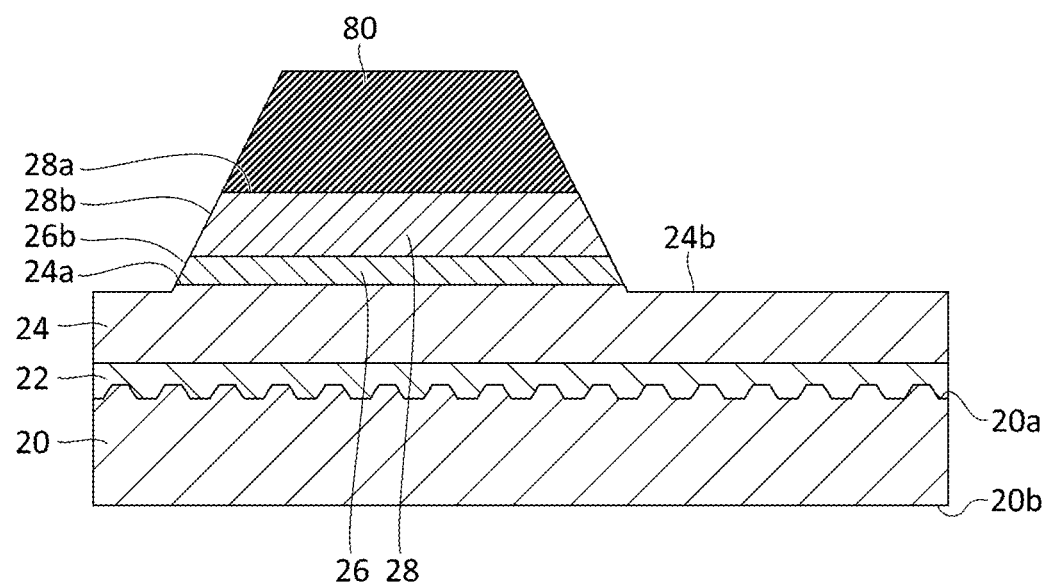
FIG. 4 schematically shows a step of manufacturing the semiconductor light-emitting element.

Subsequently, as shown in FIG. 4, a mask 80 is formed on the upper surface 28a of the p-type semiconductor layer 28 by using, for example, a publicly known lithographic technology. The p-type semiconductor layer 28 and the active layer 26 in a region not overlapping the mask 80 are removed by dry-etching or the like while the mask 80 is being formed, to expose the second upper surface 24b of the n-type semiconductor layer 24. This etching step forms the side surfaces 28b of the p-type semiconductor layer 28, the side surface 26b of the active layer 26, and the second upper surface 24b of the n-type semiconductor layer 24. The mask 80 is then removed.

Figure 5:
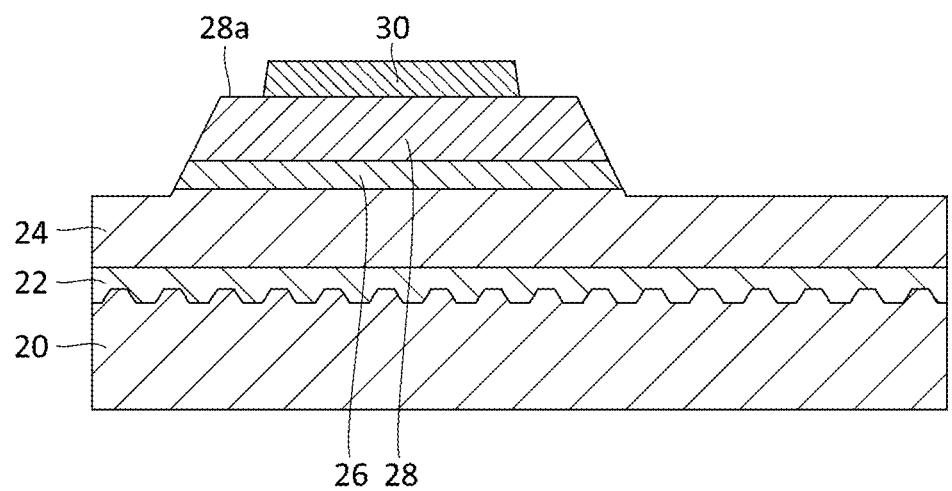
FIG. 5 schematically shows a step of manufacturing the semiconductor light-emitting element.

Then, as shown in FIG. 5, the p-side contact electrode 30 is formed on the upper surface 28a of the p-type semiconductor layer 28 by using, for example, a publicly known lithographic technology. The p-side contact electrode 30 includes a Rh layer directly in contact with the upper surface 28a of the p-type semiconductor layer 28. The Rh layer of the p-side contact electrode 30 is formed by deposition at a temperature equal to or less than 100° C. By forming the Rh layer by deposition, the damage to the upper surface 28a of the p-type semiconductor layer 28 can be reduced and the contact resistance of the p-side contact electrode 30 can be improved as compared with the case of using sputtering.

After the p-side contact electrode 30 is formed, the p-side contact electrode 30 is annealed. The p-side contact electrode 30 is annealed by using, for example, the rapid thermal annealing (RTA) method at a temperature equal to or more than 500° C. and equal to or less than 650° C. The annealing process of the p-side contact electrode 30 lowers the contact resistance of the p-side contact electrode 30 and increases the film density of the Rh layer included in the p-side contact electrode 30 to be equal to or more than 12 g/cm$^3$. The film density of the Rh layer formed by deposition at a temperature equal to or less than 100° C. is less than 12 g/cm$^3$ and is, for example, equal to or more than 11.6 g/cm$^3$ and equal to or less than 11.9 g/cm$^3$. Further, the reflectivity of the Rh layer formed by deposition at a temperature equal to or less than 100° C. for the wavelength of 280 nm is less than 65% and is, for example, about 60%-61%. Meanwhile, the film density of the Rh layer of the p-side contact electrode 30 after the annealing process will be, for example, equal to or more than 12.2 g/cm$^3$ and equal to or less than 12.5 g/cm$^3$. The reflectivity of the Rh layer of the p-side contact electrode 30 for the wavelength of 280 nm after the annealing process is equal to or more than 65% and is, for example, 66.8%.

Figure 6:
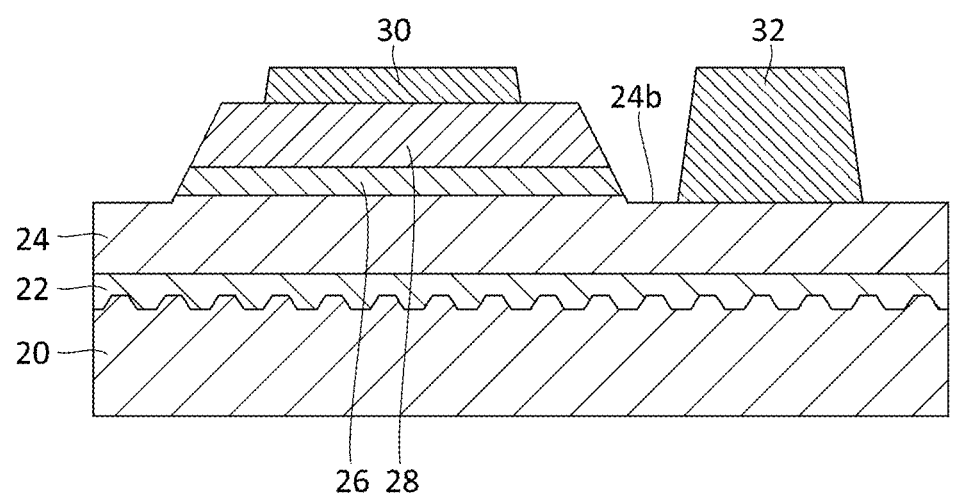
FIG. 6 schematically shows a step of manufacturing the semiconductor light-emitting element.

Then, as shown in FIG. 6, the n-side contact electrode 32 is formed on the second upper surface 24b of the n-type semiconductor layer 24 by using, for example, a publicly known lithographic technology. The n-side contact electrode 32 is in contact with the second upper surface 24b of the n-type semiconductor layer 24 and includes the first Ti layer 60, the Al layer 62, the second Ti layer 64, and the TiN layer 66 (see FIG. 3) stacked successively. The first Ti layer 60, the Al layer 62, the second Ti layer 64, and the TiN layer 66 forming the n-side contact electrode 32 are formed by sputtering.

After the n-side contact electrode 32 is formed, the n-side contact electrode 32 is annealed. The n-side contact electrode 32 is annealed by using, for example, the RTA method at a temperature equal to or more than 500° C. and equal to or less than 650° C. The annealing process of the n-side contact electrode 32 lowers the contact resistance of the n-side contact electrode 32.

Figure 7:
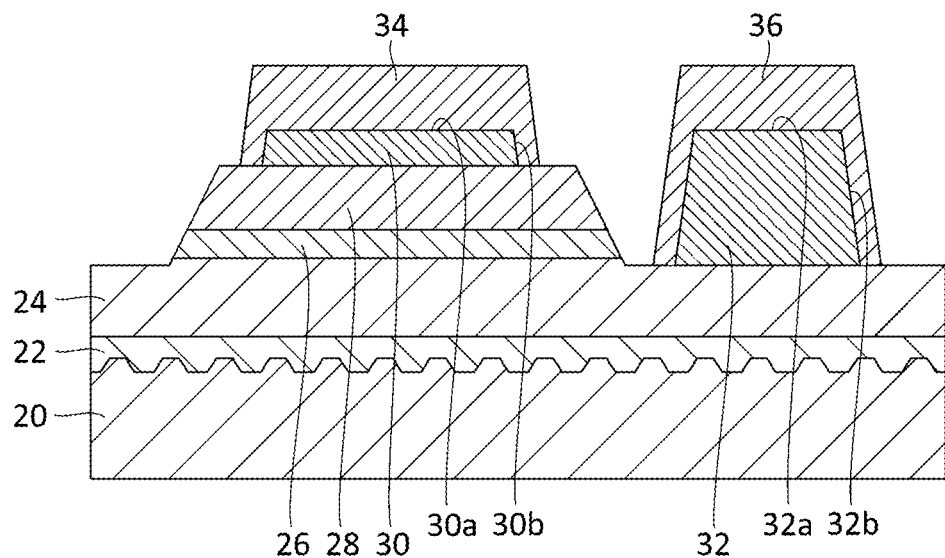
FIG. 7 schematically shows a step of manufacturing the semiconductor light-emitting element.

Subsequently, as shown in FIG. 7, the p-side current diffusion layer 34 is formed to cover the upper surface 30a and the side surface 30b of the p-side contact electrode 30, and the n-side current diffusion layer 36 is formed to cover the upper surface 32a and the side surface 32b of the n-side contact electrode 30, by using, for example, a publicly known lithographic technology. The p-side current diffusion layer 34 and the n-side current diffusion layer 36 can be formed simultaneously at a temperature equal to or less than 100° C. by sputtering that uses an Ar gas. The p-side current diffusion layer 34 and the n-side current diffusion layer 36 may be formed separately. As shown in FIGS. 2 and 3, the first TiN layers 50, 68 are formed first, and then the multilayer metal films 52, 70 including the Ti layers 52a, 70a and the Rh layers 52b, 70b are formed on the first TiN layers 50, 68, and the second TiN layers 54, 72 are formed on the multilayer metal films 52, 70. The Ti layers 56, 74 and the Au layers 58, 76 may further be formed on the second TiN layers 54, 72. The film density of the Rh layer formed by sputtering at a temperature equal to or less than 100° C. is less than 12.0 g/cm$^3$ and is, for example, equal to or more than 11.6 g/cm$^3$ and equal to or less than 11.9 g/cm$^3$. The reflectivity of the Rh layer formed by sputtering at a temperature equal to or less than 100° C. for the wavelength of 280 nm is less than 65% and is, for example, about 60%-61%.

Figure 8:
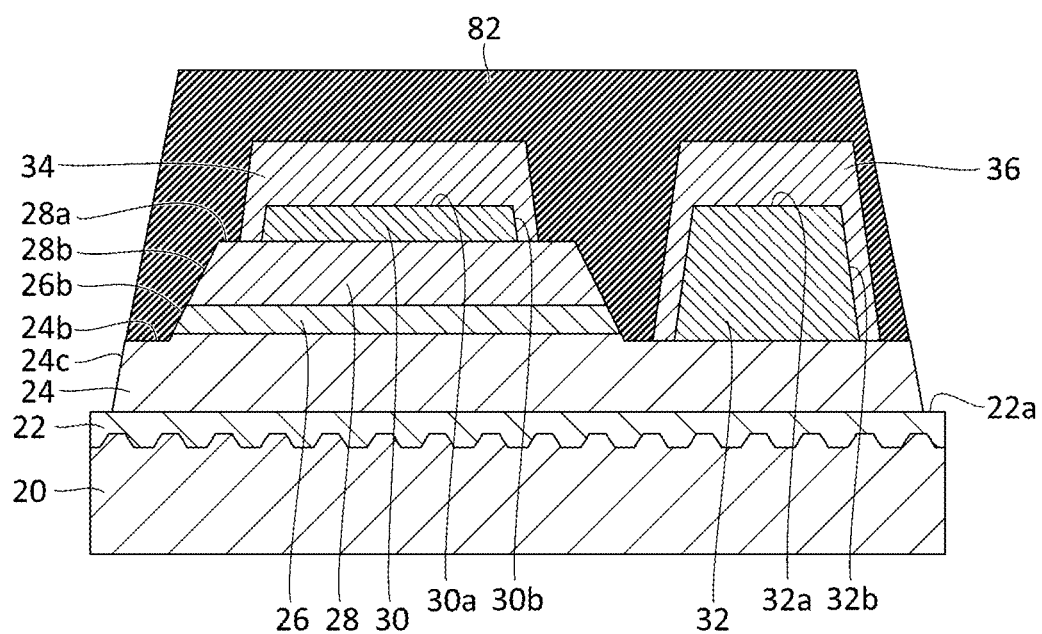
FIG. 8 schematically shows a step of manufacturing the semiconductor light-emitting element.

Subsequently, as shown in FIG. 8, a mask 82 is formed on the n-side semiconductor layer 24, the active layer 26, the p-type semiconductor layer 28, the p-side current diffusion layer 34, and the n-side current diffusion layer 36 by using, for example, a publicly known lithographic technology. After the mask 82 is formed, the n-type semiconductor layer 24 in a region not overlapping the mask 82 is removed by dry-etching or the like to expose the upper surface 22a of the base layer 22. This etching step forms the side surface 24c of the n-type semiconductor layer 24. The mask 82 is then removed.

Figure 9:
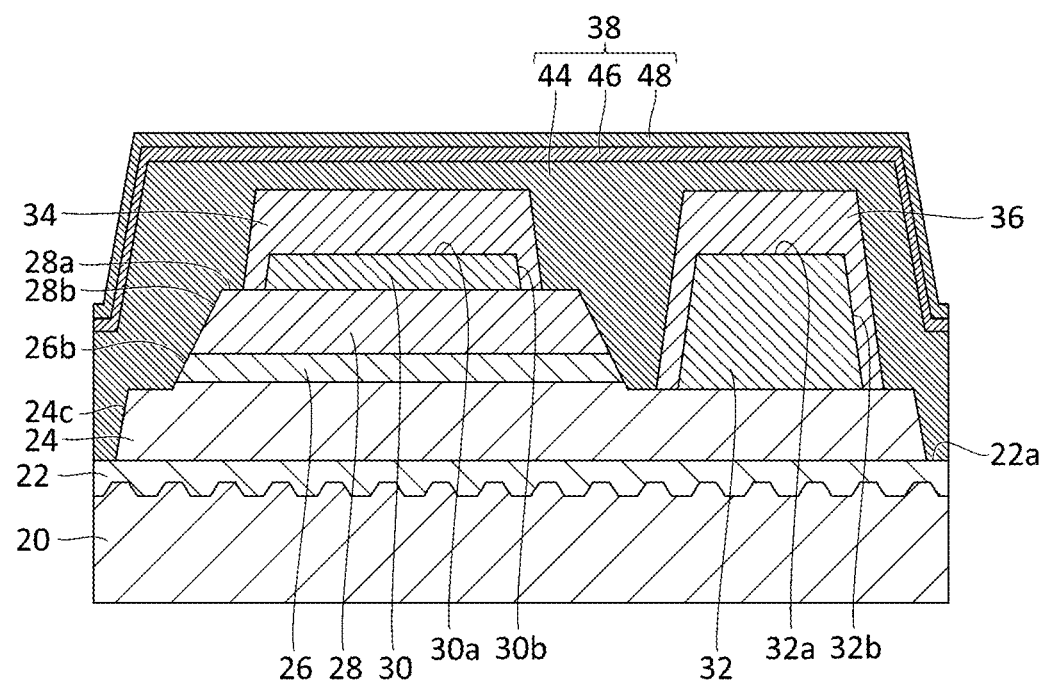
FIG. 9 schematically shows a step of manufacturing the semiconductor light-emitting element.

Subsequently, as shown in FIG. 9, the protective layer 38 is formed to cover the entirety of the upper surface of the element structure. First, the first dielectric layer 44 made of the first oxide material is formed. The first dielectric layer 44 can be made of SiO$_2$ and can be formed by plasma enhanced chemical vapor deposition (PECVD). The first dielectric layer 44 is provided to cover the upper surface 22b of base layer 22, the second upper surface 24b and the side surface 24c of the n-type semiconductor layer 24, a side surface 26c of the active layer 26, the upper surface 28a and a side surface 28c of the p-type semiconductor layer 28, the p-side current diffusion layer 34, and the n-side current diffusion layer 36.

Subsequently, the second dielectric layer 46 made of the second oxide material is formed on the first dielectric layer 44. The second dielectric layer 46 is formed to cover the entirety of the upper surface of the first dielectric layer 44. The second dielectric layer 46 can be made of Al$_2$O$_3$ and can be formed by atomic layer deposition (ALD). By using the ALD method, a tight dielectric film having a high film density can be formed. The third dielectric layer 48 made of SiO$_2$ is then formed on the second dielectric layer 46. The third dielectric layer 48 is formed to cover the entirety of the upper surface of the second dielectric layer 46. The third dielectric layer 48 can be formed by using the ALD method.

In the step of forming the protective layer 38, the p-side current diffusion layer 34 and the n-side current diffusion layer 36 are heated at a temperature equal to or more than 200° C. and equal to or less than 400° C. The film density of the Rh layers 52b, 70b included in the p-side current diffusion layer 34 and the n-side current diffusion layer 36 is increased to be equal to or more than 12.0 g/cm$^3$ by heating the p-side current diffusion layer 34 and the n-side current diffusion layer 36 at a temperature equal to or more than 200° C. and equal to or less than 400° C. The film density of the Rh layer formed by sputtering at a temperature equal to or less than 100° C. is less than 12.0 g/cm$^3$ and is, for example, equal to or more than 11.6 g/cm$^3$ and equal to or less than 11.9 g/cm$^3$. Further, the reflectivity of the Rh layers 52b, 70b formed by sputtering at a temperature equal to or less than 100° C. for ultraviolet light having a wavelength of 280 nm is less than 65% and is, for example, about 60%-61%. Meanwhile, the Rh layers 52b, 70b heated at a temperature equal to or more than 200° C. and equal to or less than 400° C. has, for example, a film density equal to or more than 12.2 g/cm$^3$ and less than 12.5 g/cm$^3$ and has a reflectivity equal to or more than 65% (for example, 66%) for ultraviolet light having a wavelength of 280 nm.

When the Rh layer formed by sputtering at a temperature equal to or less than 100° C. is annealed at a temperature equal to or more than 500° C. and equal to or less than 650° C., the film density of the annealed Rh layer will be less than 12.0 g/cm$^3$. It is therefore preferred to anneal the p-side contact electrode 30 and the n-side contact electrode 32 before the p-side current diffusion layer 34 and the n-side current diffusion layer 36 are formed.

Subsequently, as shown in FIG. 1, the protective layer 38 is removed in part by dry-etching or the like to form the p-side pad opening 38p and the n-side pad opening 38n, by using, for example, a publicly known lithographic technology. The p-side pad opening 38p and the n-side pad opening 38n are formed to extend through the first dielectric layer 44, the second dielectric layer 46, and the third dielectric layer 48. The p-side current diffusion layer 34 is exposed in the p-side pad opening 38p, and the n-side current diffusion layer 36 is exposed in the n-side pad opening 38n. Subsequently, the p-side pad electrode 40 connected to the p-side current diffusion layer 34 in the p-side pad opening 38p is formed to block the p-side pad opening 38p, and the n-side pad electrode 42 connected to the n-side current diffusion layer 36 in the n-side pad opening 38n is formed to block the n-side pad opening 38n. The p-side pad electrode 40 and the n-side pad electrode 42 may be formed simultaneously but may be formed separately.

The semiconductor light-emitting element 10 shown in FIG. 1 is completed through the steps described above.

According to the embodiment, adhesion of the protective layer 38 to the p-side contact electrode 30 can be improved by covering the upper surface 30a and the side surface 30b of the p-side contact electrode 30, which includes the Rh layer, and forming the protective layer 38 in contact with the p-side current diffusion layer 34.

According to the embodiment, the Rh layer included in the p-side current diffusion layer 34 can be used as an etching stop layer when the pad opening 38p is formed in the protective layer 38. This prevents a damage to the Rh layer included in the p-side contact electrode 30 and prevents the reflective characteristics of the p-side contact electrode 30 from being lowered.

According to the embodiment, the film density of the Rh layer included in the p-side contact electrode 30 is equal to or more than than 12.0 g/cm$^3$ so that the Rh layer included in the p-side contact electrode 30 can be configured to be dense to increase the reflectivity for ultraviolet light. Further, the film density of the Rh layer 52b included in the p-side current diffusion layer 34 is also equal to or more than 12.0 g/cm$^3$ so that the Rh layer included in the p-side currently diffusion layer 34 can be configured to be dense to increase the quality of sealing by the p-side current diffusion layer 34.

According to the embodiment, the Rh layer included in the p-side contact electrode 30 can be configured to be dense and the reflectivity for ultraviolet light can be increased by configuring the film density of the Rh layer included in the p-side contact electrode 30 to be larger than the film density of the Rh layer 52b included in the p-side current diffusion layer 34 and, for example, equal to or more than 12.4 g/cm3.

According to the embodiment, the Ar concentration in the Rh layer included in the p-side contact electrode 30 is smaller than the Ar concentration in the Rh layer 52 included in the p-side current diffusion layer 34 and is less than $1 \times 10^{18}$/cm$^3$ so that the film quality of the Rh layer included in the p-side contact electrode 30 can be improved. This allows the p-side contact electrode 30 to function as a highly efficient reflection electrode.

According to the embodiment, inclusion of the Rh layer 52b in the p-side current diffusion layer 34 can increase the quality of sealing of the p-side contact electrode 30. Similarly, inclusion of the Rh layer 70b in the n-side current diffusion layer 36 can increase the quality of sealing of the n-side contact electrode 32. Further, the film density of the Rh layers 52b, 70b included in the p-side current diffusion layer 34 and the n-side current diffusion layer 36 is equal to or more than 12.0 g/cm$^3$ so that the Rh layers 52b, 70b included in the p-side current diffusion layer 34 and the n-side current diffusion layer 36 can be configured to be dense to increase the quality of sealing even further.

According to the embodiment, formation of the Rh layer included in the p-side contact electrode 30 by deposition can suppress the damage done to the upper surface 28a of the p-type semiconductor layer 28 when the Rh layer is formed and lower and the contact resistance of the p-side contact electrode 30 more successfully than sputtering. Meanwhile, formation of the Rh layer 52b included in the p-side current diffusion layer 34 by sputtering can increase adhesion to the p-side contact electrode 30 and suppress exfoliation of the p-side current diffusion layer 34 more successfully than deposition.

According to the embodiment, formation of the Rh layer included in the p-side contact electrode 30 by deposition can prevent mixture of the Ar gas used in sputtering and improve the film quality of the Rh layer as compared with sputtering.

According to the embodiment, annealing the p-side contact electrode 30 at a temperature equal to or more than 500° C. and equal to or less than 650° C. can lower the contact resistance of the p-side contact electrode 30 and improve the film density of the Rh layer included in the p-side contact electrode 30 as compared to the levels before the annealing.

According to the embodiment, heating the p-side current diffusion layer 34 and the n-side current diffusion layer 36 at a temperature equal to or more than 200° C. and equal to or less than 400° C. can increase the film density of the Rh layers 52b, 70b included in the p-side current diffusion layer 34 and the n-side current diffusion layer 36 as compared to the level before the heating. This can increase the quality of sealing of the p-side current diffusion layer 34 and the n-side current diffusion layer 36.

Described above is an explanation based on an exemplary embodiment. The embodiment is intended to be illustrative only and it will be understood by those skilled in the art that various design changes are possible and various modifications are possible and that such modifications are also within the scope of the present invention.

A description will be given below of some aspects of the present invention.

A semiconductor light-emitting element according to the first aspect includes: an n-type semiconductor layer made of an n-type AlGaN-based semiconductor material; an active layer provided on the n-type semiconductor layer and made of an AlGaN-based semiconductor material; a p-type semiconductor layer provided on the active layer; a p-side contact electrode that includes a Rh layer in contact with an upper surface of the p-type semiconductor layer; and a p-side current diffusion layer that is in contact with an upper surface and a side surface of the p-side contact electrode and includes a TiN layer, a Ti layer, a Rh layer, and a TiN layer stacked successively, wherein a film density of the Rh layer included in the p-side contact electrode is equal to or more than 12.0 g/cm$^3$, and a film density of the Rh layer included in the p-side current diffusion layer is equal to or more than 12.0 g/cm$^3$. According to the first aspect, the quality of sealing of the p-side contact electrode can be increased by covering the upper surface and the side surface of the p-side contact electrode, which includes the Rh layer, by the p-side current diffusion layer, which includes the Rh layer. Further, the Rh layer included in the p-side contact electrode can be configured to be dense to increase the reflectivity for ultraviolet light, and the Rh layer included in the p-side current diffusion layer can be configured to be dense to improve the quality of sealing by the p-side current diffusion layer.

The second aspect relates to the semiconductor light-emitting element according to the first aspect, wherein a film density of the Rh layer included in the p-side contact electrode is larger than a film density of the Rh layer included in the p-side current diffusion layer. According to the second aspect, the Rh layer included in the p-side contact electrode can be configured to be denser to increase the reflectivity for ultraviolet light further.

The third aspect relates to the semiconductor light-emitting element according to the first or second aspect, wherein an Ar concentration in the Rh layer included in the p-side contact electrode is smaller than an Ar concentration in the Rh layer included in the p-side current diffusion layer. According to the third aspect, the film quality of the p-side contact electrode can be improved, and the p-side contact electrode can be allowed to function as a highly efficient reflection electrode by configuring the Ar concentration to be small.

The fourth aspect of the present invention relates to the semiconductor light-emitting element according to the third aspect, wherein the Ar concentration in the Rh layer included in the p-side contact electrode is less than $1\times10^{18}/cm^3$, and the Ar concentration in the Rh layer included in the p-side current diffusion layer is equal to or more than $1\times10^{18}/cm^3$. According to the fourth aspect, the film quality of the p-side contact electrode can be improved, and the p-side contact electrode can be allowed to function as a highly efficient reflection electrode.

The fifth aspect of the present invention relates to a method of manufacturing a semiconductor light-emitting element, including: forming an active layer made of an AlGaN-based semiconductor material on an n-type semiconductor layer made of an n-type AlGaN-based semiconductor material; forming a p-type semiconductor layer on the active layer; forming a p-side contact electrode that includes a Rh layer in contact with an upper surface of the p-type semiconductor layer by deposition; annealing the p-side contact electrode at a temperature equal to or more than 500° C. and equal to or less than 650° C.; forming a p-side current diffusion layer in contact with an upper surface and a side surface of the p-side contact electrode and including a TiN layer, a Ti layer, a Rh layer, and a TiN layer stacked successively; and heating the p-side current diffusion layer at a temperature equal to or more than 200° C. and equal to or less than 400° C. According to the fifth aspect, formation of the Rh layer included in the p-side contact electrode by deposition can suppress the damage done to the upper surface of the p-type semiconductor layer when the Rh layer is formed and lower and the contact resistance of the p-side contact electrode more successfully than sputtering. Meanwhile, formation of the Rh layer included in the p-side current diffusion layer by sputtering can increase adhesion to the p-side contact electrode and suppress exfoliation of the p-side current diffusion layer more successfully than deposition. Also, annealing the p-side contact electrode at a temperature equal to or more than 500° C. and equal to or less than 650° C. can lower the contact resistance of the p-side contact electrode and improve the film density of the p-side contact electrode as compared to the pre-annealing levels. Further, heating the p-side current diffusion layer at a temperature equal to or more than 200° C. and equal to or less than 400° C. can increase the film density of the Rh layer included in the p-side current diffusion layer as compared to the pre-heating level. This can increase the quality of sealing of the p-side current diffusion layer.

What is claimed is:

1. A semiconductor light-emitting element comprising:
   an n-type semiconductor layer made of an n-type AlGaN-based semiconductor material;
   an active layer provided on the n-type semiconductor layer and made of an AlGaN-based semiconductor material;
   a p-type semiconductor layer provided on the active layer;
   a p-side contact electrode that includes a Rh layer in contact with an upper surface of the p-type semiconductor layer; and
   a p-side current diffusion layer that is in contact with an upper surface and a side surface of the p-side contact electrode and includes a TiN layer, a Ti layer, a Rh layer, and a TiN layer stacked successively, wherein
   a film density of the Rh layer included in the p-side contact electrode is equal to or more than 12.0 g/cm³, and
   a film density of the Rh layer included in the p-side current diffusion layer is equal to or more than 12.0 g/cm³.

2. The semiconductor light-emitting element according to claim 1, wherein
   the film density of the Rh layer included in the p-side contact electrode is larger than the film density of the Rh layer included in the p-side current diffusion layer.

3. The semiconductor light-emitting element according to claim 1, wherein
   an Ar concentration in the Rh layer included in the p-side contact electrode is smaller than an Ar concentration in the Rh layer included in the p-side current diffusion layer.

4. The semiconductor light-emitting element according to claim 3, wherein
   the Ar concentration in the Rh layer included in the p-side contact electrode is less than $1\times10^{18}/cm^3$, and
   the Ar concentration in the Rh layer included in the p-side current diffusion layer is equal to or more than $1\times10^{18}/cm^3$.

5. A method of manufacturing a semiconductor light-emitting element, comprising:
   forming an active layer made of an AlGaN-based semiconductor material on an n-type semiconductor layer made of an n-type AlGaN-based semiconductor material;
   forming a p-type semiconductor layer on the active layer;
   forming a p-side contact electrode that includes a Rh layer in contact with an upper surface of the p-type semiconductor layer by deposition;
   annealing the p-side contact electrode at a temperature equal to or more than 500° C. and equal to or less than 650° C.;
   forming a p-side current diffusion layer in contact with an upper surface and a side surface of the p-side contact electrode and including a TiN layer, a Ti layer, a Rh layer, and a TiN layer stacked successively; and
   heating the p-side current diffusion layer at a temperature equal to or more than 200° C. and equal to or less than 400° C.

* * * * *